United States Patent [19]

Mikado

[11] 4,122,488
[45] Oct. 24, 1978

[54] SYNC SIGNAL GENERATOR WITH MEMORIZATION OF PHASE DETECTION OUTPUT

[75] Inventor: Tsuneo Mikado, Hachioji, Japan

[73] Assignee: Nippon Television Industry Corporation, Tokyo, Japan

[21] Appl. No.: 783,773

[22] Filed: Apr. 1, 1977

[30] Foreign Application Priority Data

May 10, 1976 [JP] Japan .................................. 51-53072
Aug. 23, 1976 [JP] Japan ................................. 51-100368

[51] Int. Cl.² ....................... H04N 9/46; H04N 5/06; H03B 3/06
[52] U.S. Cl. .................................... 358/19; 358/158; 331/20
[58] Field of Search ................... 358/8, 19, 26, 148, 358/149, 158, 150; 331/20; 360/38

[56] References Cited

U.S. PATENT DOCUMENTS

| 3,507,983 | 4/1970 | Leman | 358/19 |
| 3,659,040 | 4/1972 | Fujita | 358/19 |
| 3,909,839 | 9/1975 | Inaba et al. | 358/8 |
| 4,015,287 | 3/1977 | Hovens | 358/19 |
| 4,015,288 | 3/1977 | Ebihara et al. | 358/19 |

OTHER PUBLICATIONS

Radio Shack Dictionary of Electronics, 1974–1975, 4th edition, 1974, p. 527.

Primary Examiner—John C. Martin
Attorney, Agent, or Firm—Woodcock, Washburn, Kurtz & Mackiewicz

[57] ABSTRACT

A television synchronizing signal generator includes a synchronizing signal separator circuit for separating a synchronizing signal from a video signal, an oscillator the oscillatory frequency of which is controllable, a phase discriminator for discriminating outputs of the synchronizing signal separator circuit and the oscillator, a memory circuit for memorizing an output of the phase discriminator, a switching circuit for applying alternatively the output of the phase discriminator and the output of the memory as a control signal to the oscillator to control the oscillatory frequency thereof, and an input state detector for detecting the input amplitude and noise state of the video signal such that the switching action of the switching circuit is controlled in accordance with the output of the input state detector. With such a generator, a stable picture can be obtained in a television receiver, even although the received video signal is temporarily abnormal.

9 Claims, 7 Drawing Figures

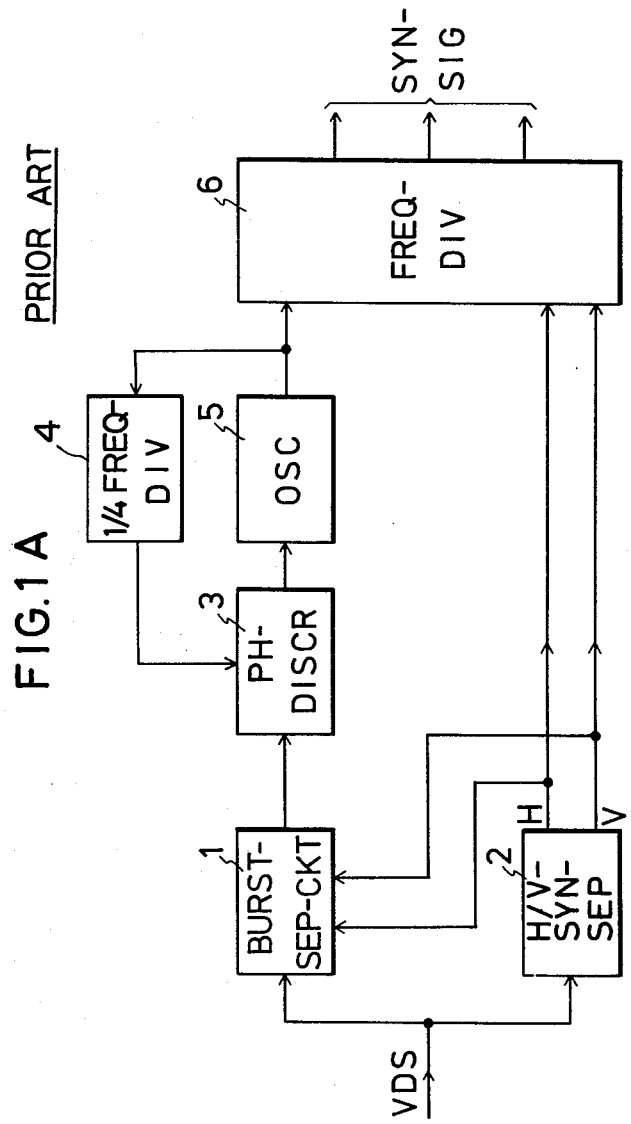

SYNC SIGNAL GENERATOR WITH MEMORIZATION OF PHASE DETECTION OUTPUT

BACKGROUND OF THE INVENTION

1. Field of the Invention

This invention relates to a synchronizing signal generator for deriving synchronizing signals in dependence on a video signal, and more particularly to a synchronizing signal generator suitable for use in a television transmitter of a television broadcast station or a domestic television receiver.

2. Description of the Prior Art

FIGS. 1A and 1B show block diagrams of two known synchronizing signal generators for television transmitters.

In the synchronizing signal generator of FIG. 1A, an externally supplied input video signal VDS is applied to a burst separator circuit 1 and to a horizontal and vertical synchronizing separator circuit 2. A horizontal synchronizing signal and a vertical synchronizing signal are separated from the video signal by the synchronizing separator circuit 2. A color burst signal is separated from the video signal by the burst separator circuit 1, to which the horizontal and vertical synchronizing signals are applied to obtain burst gate pulses for separating the burst signal.

The separated burst signal is applied to a phase discriminator 3. An output of a quarter frequency divider 4, which forms a comparison signal, is compared in phase with the burst signal by the phase discriminator 3. An output voltage is obtained from the phase discriminator 3 in dependence on the phase difference between the burst signal and the comparison signal. The output voltage of the phase discriminator 3 is applied to a voltage-controlled oscillator 5, as a control signal. The oscillation frequency of the oscillator 5 is controlled by the output voltage of the phase discriminator 3. The controlled oscillation frequency (14.3 MHz) is four times the frequency (3.58 MHz) of the burst signal.

The output frequency of the oscillator 5 is divided by the quarter frequency divider 4, and is applied to the phase descriminator 3 to be compared with the burst signal. The output frequency of the oscillator 5 is also applied to a frequency divider 6, as a standard frequency signal, and it is divided by the frequency divider 6. Synchronizing signals synchronized with the synchronizing signals contained in the input video signal are obtained from the frequency divider 6. This is sometimes referred to as gen-lock.

A color burst signal (3.58 MHz) is obtained by ¼ division of the standard frequency signal (14.3 MHz); a horizontal synchronizing signal (15.73 KHz) is obtained by ½ · (1/455) division of the standard frequency signal; and a vertical synchronizing signal (59.9 Hz) is obtained by (1/525) · (1/455) division of the standard frequency signal, by the frequency divider 6. The horizontal and vertical synchronizing signals are synchronized with corresponding signals in the video signal, by supplying outputs of the synchronizing separator circuit 2, namely horizontal and vertical synchronizing signals, as reset pulses to the frequency divider 6.

In the other synchronizing signal generator, shown in FIG. 1B, parts which correspond to parts in FIG. 1A are denoted by the same reference numerals. The output signal P of the phase discriminator 3 is applied as a control signal to the voltage-controlled oscillator 5 through a resistor 7, and it is further applied to an input terminal of a low frequency amplifier 35. An output voltage q of the low frequency amplifier 35 is applied to the oscillator 5.

The low frequency amplifier 35 comprises resistors 8 and 9, capacitors 10 and 11, and an amplifier 12. The output signal P of the phase discriminator 3 is applied to the amplifier 12 through an integrating circuit comprising the resistor 8 and the capacitor 10. The non-inverting amplification factor of the amplifier 12 is about a thousand. The output of the amplifier 12 is smoothed by the capacitor 11, and applied through the resistor 9 to the oscillator 5, as the signal q. The signal q is a low frequency signal which is nearly a dc voltage, due to the function of the integrating circuit and the capacitor 11. The levels of the signals P and q vary with deviations $\Delta f$ from the central frequency at the phase discriminator 3, as shown in FIG. 2.

In the automatic frequency control loop including the phase discriminator 3, the quarter frequency divider 4 and the oscillator 5, the control signal P functions as a lock-in signal quickly to control frequencies which deviate substantially from the central frequency, and the control signal q functions as a lock-hold signal to control frequencies which deviate only slightly from the central frequency.

In the known circuits shown in FIGS. 1A and 1B, the output voltage of the phase discriminator 3 is applied to the voltage-controlled oscillator 5, as the control signal. The oscillator 5 is designed to continue oscillating when the synchronizing signals in the input video signal include noise or disappear. However, when a normal input video signal is again received, there is the possibility that there is a difference between the self-oscillating frequency of the oscillator 5 and the frequency to be synchronized. In that case, the frequency of the oscillator 5 varies until it is synchronized with the frequency of the synchronizing signal in the input video signal, that is until gen-lock is again established. In this case, the frequencies of the signals obtained from the frequency divider 6 vary, and so the picture is distorted.

SUMMARY OF THE INVENTION

Accordingly, it is an object of this invention to provide an improved synchronizing signal generator in which this defect is substantially overcome.

Another object of this invention is to provide a synchronizing signal generator by which a very stable synchronizing signal can be obtained even when an externally-applied synchronizing signal includes noise or it is omitted from an input video signal.

A further object of this invention is to provide a synchronizing signal generator in which a control is effected using a memory.

According to this invention, a synchronizing signal generator includes a synchronizing signal separator circuit for separating a synchronizing signal from a video signal, an oscillator the oscillatory frequency of which is controllable, a phase discriminator for discriminating outputs of the synchronizing signal separator circuit and the oscillator, a memory for memorizing an output of the phase discriminator, a switching circuit for applying alternatively the output of the phase discriminator and the output of the memory, as a control signal, to the oscillator to control the oscillatory frequency thereof, and an input state detector for detecting the input amplitude and noise state of the video signal, the switching action of the switching circuit being controlled in accordance with the output of the input state detector.

The above, and other objects, features and advantages of this invention, will be apparent in the following detailed description of an illustrative embodiment which is to be read in connection with the accompanying drawings.

BRIEF DESCRIPTION OF THE DRAWINGS

FIGS. 1A and 1B are block diagrams of known synchronizing signal generators;

DESCRIPTION OF THE PREFERRED EMBODIMENTS

Figure 1B:
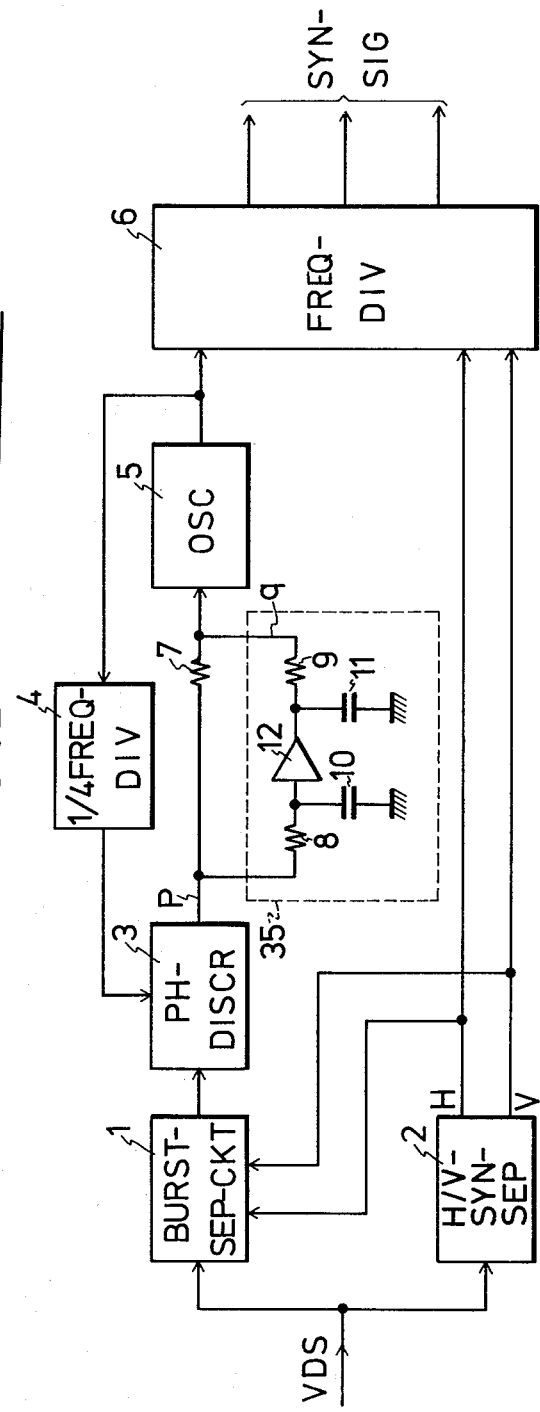
Figure 2:
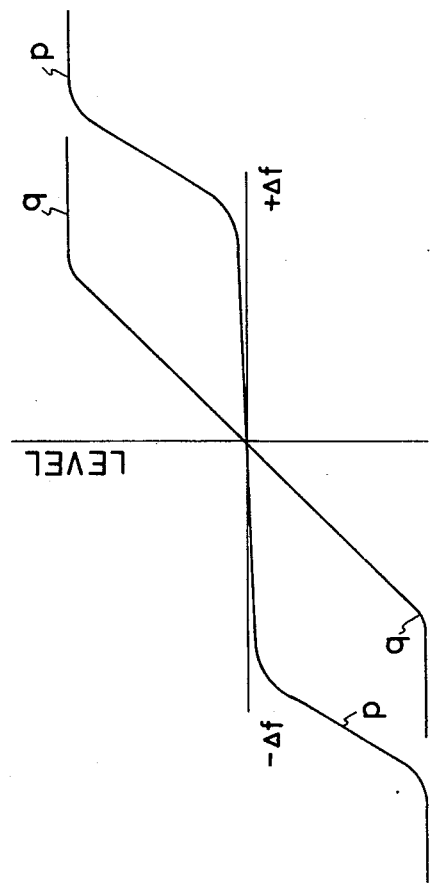
FIG. 2 is a graph showing the input signal characteristics for a voltage-controlled oscillator in FIG. 1B.

Embodiments of this invention will now be described with reference to FIGS. 3 to 6. Parts in the embodiments which correspond to parts in FIGS. 1A and 1B are denoted by the same reference numerals.

Figure 3:
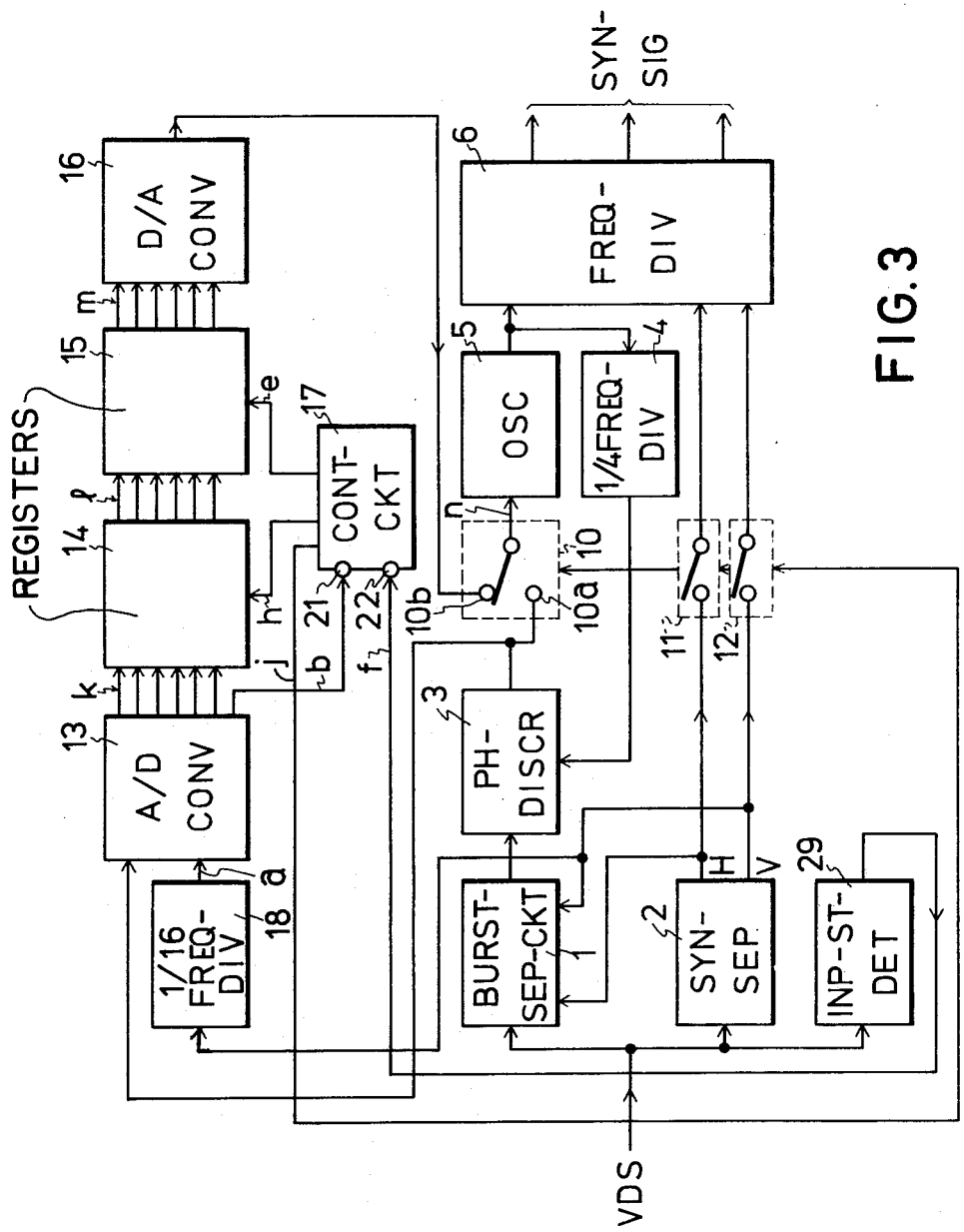
FIG. 3 is a block diagram of a synchronizing signal generator according to one embodiment of this invention.

Referring to FIG. 3, the output voltage of the phase discriminator 3 is applied to one terminal 10a of a switching circuit 10, and to an analog to digital (A/D) converter 13 to be converted to a parallel six-bit digital signal. This digital signal is applied to a first register means 14. The conversion may be effected from several times to some tens of thousands times per second. In this embodiment, the frequency of the vertical synchronizing signal from the synchronizing separator circuit 2 is divided by a one-sixteenth frequency divider 18 to give a signal a (FIG. 5) of 3.75 Hz which is applied to the A/D converter 13, as a sampling pulse. Accordingly, the A/D conversion is effected 3.75 times per second. An end signal b (FIG. 5) is obtained from the A/D converter 13 at the end of every analog to digital conversion, and is applied to a control circuit 17.

As described above, the output of the A/D converter 13 is applied to the first register means 14, and in turn the output of the first register means 14 is applied to a second register means 15. Both the first and second registers 14 and 15 store on the basis of six-bit parallel-in/parallel-out. The loading operation of the register means 14 and 15 are controlled by a control circuit 17. The output of the second register means 15 is applied to a digital to analog (D/A) converter 16, and converted to an analog signal thereby. The analog signal is applied to another terminal 10b of the switching circuit 10.

The control circuit 17, which controls the first and second registers means 14 and 15, the switching circuit 10, and switching circuits 11 and 12, will next be described in detail with reference to FIG. 4.

The end signal b is applied to an input terminal 21 from the A/D converter 13. A signal f (FIG. 5) is applied to another input terminal 22 from an input state detector 29 (FIG. 3) for detecting the input state of the externally-applied input video signal VDS. The existence and amplitude of, and noise in the video signal are detected by the input state detector 29. For example, when the level of the video signal becomes lower than a predetermined level, an output "0" is obtained from the input state detector 29, and when the level of the video signal is normal, an output "1" is obtained from the input state detector 29.

Figure 5:
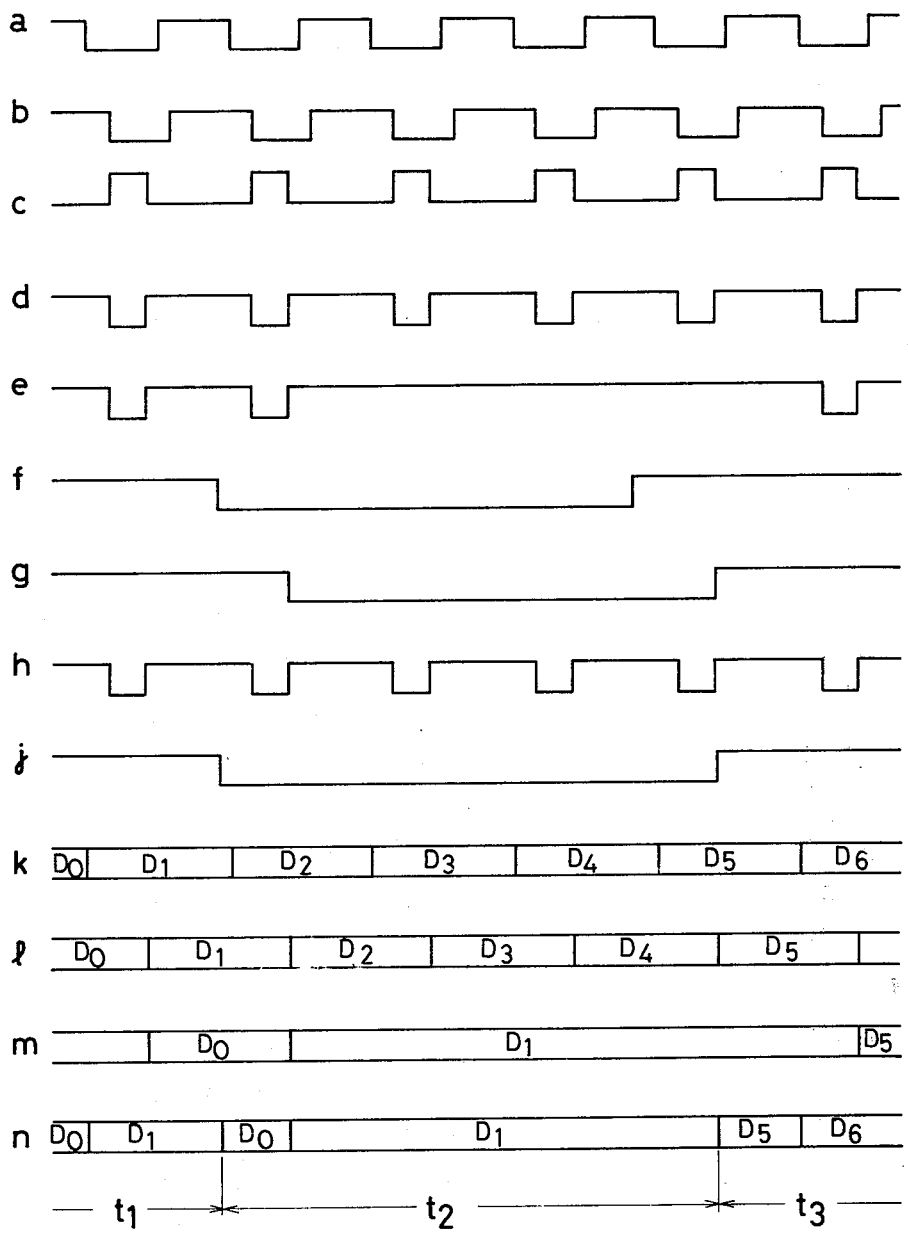
FIG. 5 shows waveforms of signals at different parts of the synchronizing signal generator.

The waveform of the end signal b is converted by a monostable multivibrator 23 to obtain a signal c (FIG. 5). The signal c is inverted by an inverter 24 to obtain a control signal h (FIG. 5). The control signal h is applied to the first shift register 14. The signal c is inverted to a signal d by an inverter 25. The signal d is applied to a T terminal of a D-type flip-flop 27. A detecting signal f is applied to a D terminal of the flip-flop 27 from the input state detector 29 through the terminal 22. A signal g (FIG. 5) is obtained from a Q-terminal of the flip-flop 27. The signal g and the signal c are applied to a NAND circuit 26. A signal e is obtained from the NAND circuit 26, and is applied as a control signal to the second shift register 15.

The output signal g of the flip-flop 27 and the signal f are applied to a NAND circuit 33. The output of the NAND circuit 33 is inverted to a signal j by an inverter 34. The signal j is applied to the switch circuits 10, 11 and 12.

In FIG. 3, the switching circuits 10, 11 and 12 may be electronic switching circuits controlled by the signal j. When the signal j is at the level "0", the terminal 10b of the switching circuit 10 is connected to the oscillator 5, and the switching circuits 11 and 12 are OFF. When the signal j is at the level "1", the terminal 10a of the switching circuit 10 is connected to the oscillator 5, and the switching circuits 11 and 12 are ON. The switching circuits 11 and 12 work to shut off the horizontal and vertical synchronizing signals supplied from the synchronizing separator circuit 2, so that the frequency divider 6 is not reset by the horizontal and vertical synchronizing signals in the manner described above, when the video signal is abnormal.

Next, operation of the above-described arrangements will be described with reference to FIGS. 3 to 5.

The output of the phase discriminator 3 is converted to the parallel six-bit digital signal by the A/D converter 13. The digital signal is renewed 3.75 times per second, and is shown as a signal k in FIG. 5. The output of the A/D converter 13 is newly memorized by the first shift register 14 on every leading edge of the control signal h. The memorized signal is shown as a signal 1 in FIG. 5. Since the signal h has the same frequency (3.75 Hz) as the signal b, the signal 1 lags behind the signal k by a predetermined time.

On the other hand, the output of the first register means 14 is newly memorized by the second register means 15 on every leading edge of the control signal e. Accordingly, while the signal g is at the level "0", the output of the first register means 14 is not newly memorized by the second register means 15. The memorized signal of the second register means 15 is shown as a signal m in FIG. 5. The signal m is converted to an analog signal by the D/A converter 16. The analog signal is applied to the terminal 10b of the switching circuit 10, while the output of the phase discriminator 3, corresponding to the digital signal k, is applied to the other terminal 10a of the switching circuit 10. When the switching circuit 10 is changed over by the signal j, the analog signal n corresponding to the digital signal m is applied to the voltage-controlled oscillator 5. Thus, during the period $t_1$ when the video signal is normal, the voltage corresponding to the digital signal k is applied to the voltage-controlled oscillator 5. During the period $t_2$ when the video signal is abnormal, the voltage corresponding to the digital signal m, memorized while the video signal was normal is applied to the voltage-controlled oscillator 5. Thereafter, during the period $t_3$ when the video signal again becomes normal, the voltage corresponding to the digital signal k is applied to the voltage-controlled oscillator 5. Thus, even when the video signal temporarily becomes abnormal, a stable picture can be obtained.

Next, another embodiment of this invention will be described with reference to FIG. 6. Waveforms at the respective parts in this embodiment which correspond to the waveforms at the respective parts in the first embodiment are shown by FIG. 5, although the times scales are different.

The output voltage of the amplifier 12 is applied to the A/D converter 13 and converted to a parallel six-bit digital signal. The conversion may be effected from several times to some tens of thousands times per second. In this embodiment, the horizontal synchronizing signal a (FIG. 5) from the synchronizing separator circuit 2 is applied to the A/D converter 13 as a sampling pulse. Accordingly, the analog to digital conversion is effected 15,734 times per second. An end signal b (FIG. 5) is obtained from the A/D converter 13 at the end of every A/D conversion, and is applied to the control circuit 17.

The output of the A/D converter 13 is applied to the first register means 14, and in turn the output of the first register means 14 is applied to a second register means 15. Both the first and second registers means 14 and 15 store on the basis of six-bit parallel-in/parallel-out. The load operations of the registers means 14 and 15 are controlled by the control circuit 17. The output of the second register means 15 is applied to a D/A converter 16, and converted to an analog signal thereby. The analog signal is applied to the voltage-controlled oscillator 5 through a resister 9 and a series connection of resistors 37 and 38. The resistances of the resistors 37 and 38 are so selected that the attenuation factor of the resistors 37 and 38 is one-thousandth, when the amplification factor of the amplifier 12 is one thousand. The attenuated signal from the resistors 37 and 38 is applied to a terminal 28b of a switching circuit 28 arranged between the phase discriminator 3 and the resistor 7. The output signal P of the phase discriminator 3 is applied to another terminal 28a of the switching circuit 28.

Figure 4:
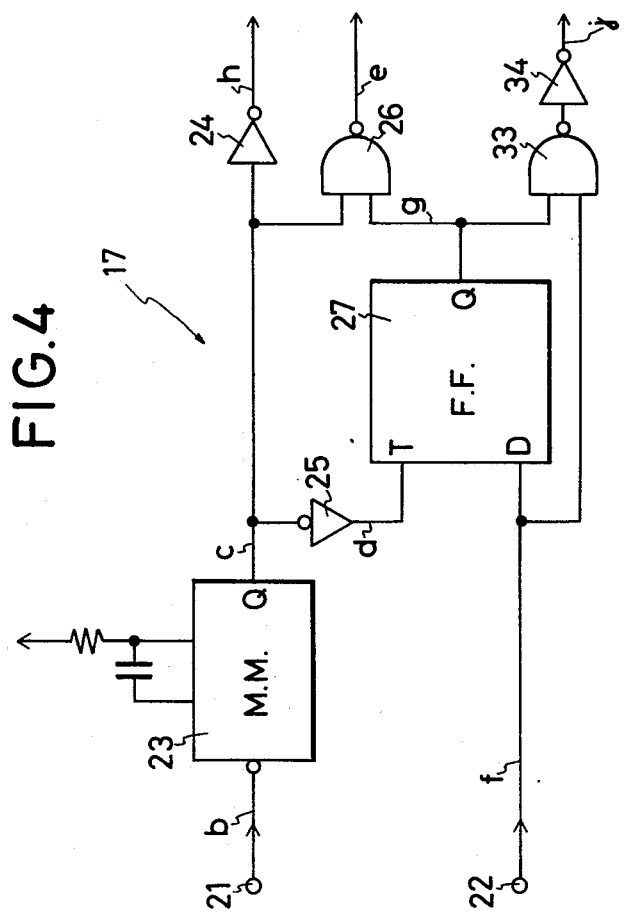
FIG. 4 is a circuit diagram of a control circuit in the generator of FIG. 3.

The control circuit 17 for controlling the first and second registers means 14 and 15, and the switching circuits 19, 20 and 28 are as shown in FIG. 4, and previously described.

Figure 6:
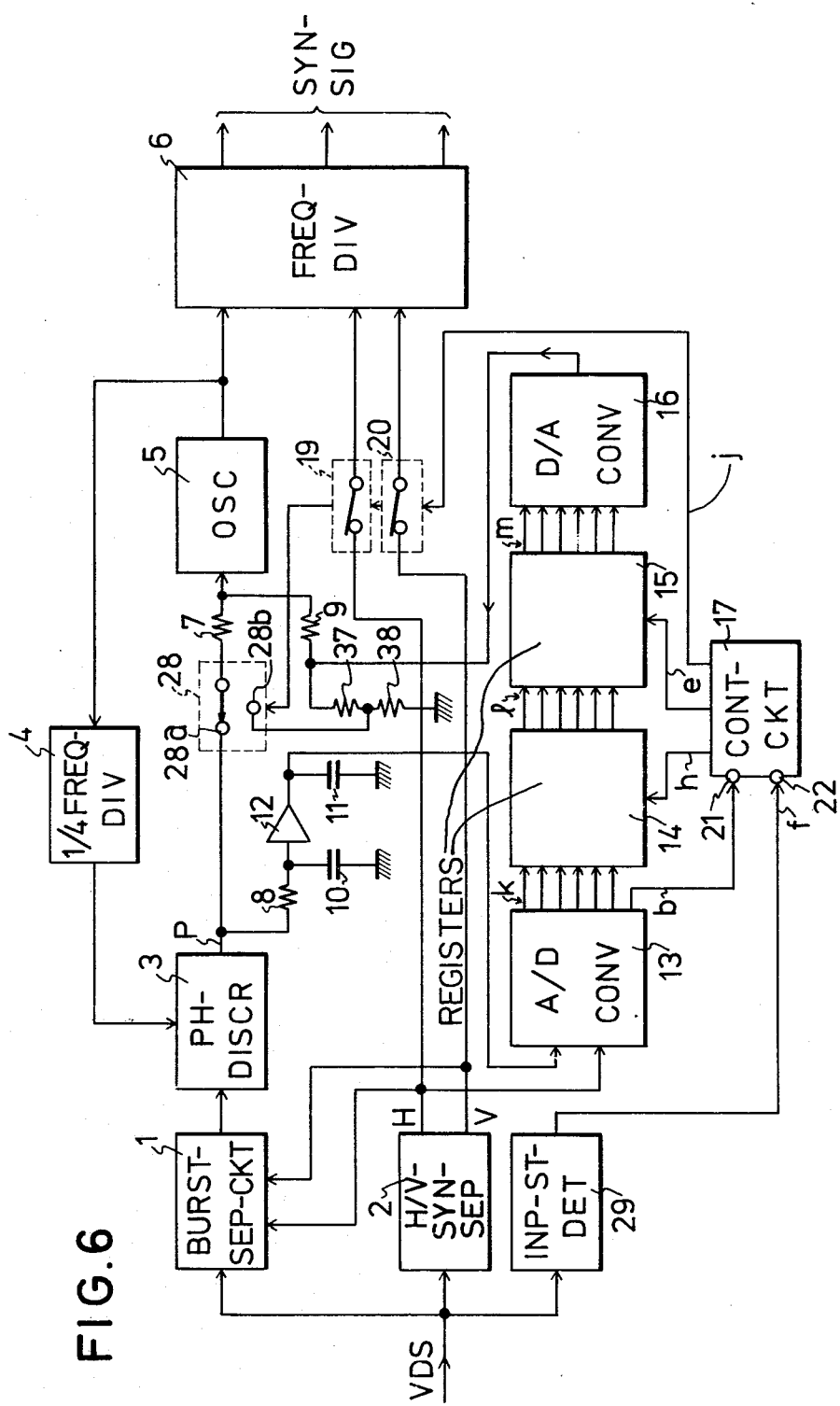
FIG. 6 is a block diagram of a synchronizing signal generator according to another embodiment of this invention.

In FIG. 6, the switching circuits 19, 20 and 28 may be electronic switching circuits controlled by the signal j. When the signal j is at the level "0", the switching circuit 28 connects the terminal 28b to the resistor 7, and the switching circuits 19 and 20 are OFF. When the signal j is at the level "1" the switching circuit 28 connects the terminal 28a to the resistor 7, and the switching circuits 19 and 20 are ON. Either the output signal P of the phase discriminator 3 or the signal obtained by dividing the output of the D/A converter 16 is selected by the switching circuit 28. The switching circuits 19 and 20 operate to shut off the horizontal and vertical synchronizing signals from the synchronizing separator circuit 2, so that the frequency divider 6 is not reset by the horizontal and synchronizing signals when the video signal is abnormal.

Next, operation of the above-described arrangements will be described with reference to FIGS. 4 to 6.

The output voltage of the phase discriminator 3 is converted to the parallel six-bit digital signal by the A/D converter 13. The digital signal is renewed 15,734 times per second, and is shown as a signal k in FIG. 5. The output of the A/D converter 13 is newly memorized by the first register means 14 on every leading edge of the control signal h. The memorized signal is shown as a signal 1 in FIG. 5. Since the signal h has the same frequency (15,734 Hz) as the signal b, the signal 1 lags a predetermined time behind the signal k.

One the other hand, the output of the first register means 14 is newly memorized by the second register means 15 on every leading edge of the control signal e. Accordingly, while the signal g is at the level "0", the output of the first register means 14 is not newly memorized by the second register means 15. The memorized signal is shown as a signal m in FIG. 5. The signal m is converted to an analog signal by the D/A converter 16. The analog signal is applied to the oscillator 5 and the terminal 28b of the switching circuit 28.

The output signal P of the phase discriminator 3 is applied to the terminal 28a of the switching circuit 28. During the period $t_1$ when the video signal is normal, the output signal P of the phase discriminator 3 as the lock-in signal, and the output signal of the D/A converter 16 as the lock-hold signal are applied to the oscillator 5. During the period $t_2$ when the video signal is abnormal, the output signal of the D/A converter 16 as the lock-hold signal which is converter from the digital signal m memorized for the normal video signal, and the signal obtained by dividing the output signal of the D/A converter 16 through the resistors 37 and 38, as the lock-in signal, are applied to the oscillator 5. During the period $t_3$ when the video signal becomes again normal, the output signal P of the phase discriminator 3 as the lock-in signal, and the output signal of the D/A converter 16 as the lock-hold signal are applied to the oscillator 5.

According to this embodiment, when the video signal in normal, the memory signal is repeatedly renewed and applied to the oscillator 5 as the control voltage. When the video signal is abnormal, the renewal of the memory signal is stopped, and the memory signal which has been memorized for the normal video signal is applied to the oscillator 5 as the control voltage.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined in the appended claims.

For example, although the two shift registers 14 and 15 are used in the above embodiments, the first shift register 14 may be omitted. In that case, the output of the A/D converter 13 is applied directly to the second shift register 15. On the other hand, more than two shift registers may be used for increasing the lag time of the output signal of the D/A converter 16.

In the above embodiments, the separated color burst signal is used for gen-lock. When a black-and-white video signal is being processed, the horizontal synchronizing signal or the vertical synchronizing signal may be used.

What is claimed is:

1. A synchronizing signal generator comprising:
   (A) a synchronizing signal separator circuit for separating a synchronizing signal from a video signal;
   (B) an oscillator the oscillatory frequency of which is controllable;
   (C) a phase discriminator for discriminating outputs of said synchronizing signal separator circuit and said oscillator;
   (D) a memory for memorizing an output of said phase discriminator;
   (E) a switching circuit for applying alternatively the output of said phase discriminator and the output of said memory, as a control signal, to said oscillator to control the oscillatory frequency of said oscillator; and
   (F) an input state detector for detecting the input amplitude and noise state of said video signal, the switching action of said switching circuit being controlled in accordance with the output of said input state detector.

2. A synchronizing signal generator according to claim 1, in which said memory includes at least one register means.

3. A synchronizing signal generator according to claim 2, in which an analog to digital converter is connected between said phase discriminator and said memory, and a digital to analog converter is connected between said memory and said oscillator.

4. A synchronizing signal generator according to claim 1, in which said switching circuit is an electronic switching circuit.

5. A synchronizing signal generator according to claim 1, in which said synchronizing signal separator circuit comprises a color burst separator circuit for separating a color burst signal from said video signal, a second synchronizing signal separator circuit for separating at least one of a horizontal synchronizing signal and a vertical synchronizing signal from said video signal, and a frequency divider are provided and in which the output of said oscillator is applied to said frequency divider, the output of said second synchronizing signal separator circuit is applied through a second switching circuit to said frequency divider as a reset signal for said frequency divider, and the switching action of said second switching circuit is controlled in accordance with the output of an input state detector for detecting the input amplitude and noise state of said video signal.

6. A synchronizing signal generator according to claim 5, in which said second switching circuit is an electronic switching circuit.

7. A synchronizing signal generator according to claim 3, in which said memory includes first and second register means, said first and second register means being controlled with the output of said input state detector so that said first register means acts repeatedly to memorize the output of said phase discriminator at constant intervals, said second register means acts repeatedly to memorize the output of said first register means at said constant intervals while the input amplitude and noise state of said video signal is normal, and the repeated memorizing action of said second register means is ceased, when the input amplitude or noise state of said video signal is abnormal.

8. A synchronizing signal generator according to claim 1, in which there is provided a first line for applying the output of said phase discriminator as a lock-in signal to said oscillator, a second line for applying the output of said phase discriminator as a lock-hold signal to said oscillator, said memory being in said second line, an amplifier in said second line, and an attenuator between said memory and said switching circuit; and said switching circuit acts to apply alternatively the output of said phase discriminator and the output of said attenuator as said lock-in signal to said oscillator.

9. A synchronizing signal generator according to claim 8, in which the reciprocal of the amplification factor of said amplifier is substantially equal to the attenuation factor of said attenuator.

* * * * *